United States Patent [19]

Allen et al.

[11] Patent Number: 5,606,322

[45] Date of Patent: Feb. 25, 1997

[54] DIVERGENT CODE GENERATOR AND METHOD

[75] Inventors: Steven P. Allen; Robert J. Durette, both of Mesa, Ariz.

[73] Assignee: Motorola, Inc., Schaumburg, Ill.

[21] Appl. No.: 327,953

[22] Filed: Oct. 24, 1994

[51] Int. Cl.$^6$ .............................. G08C 19/12; H04L 17/02
[52] U.S. Cl. .............................. 341/173; 380/50; 380/34; 370/303; 340/825.31
[58] Field of Search ........................... 341/173, 185, 341/187; 340/825.31; 380/50, 21, 34; 370/46

[56] References Cited

U.S. PATENT DOCUMENTS

| | | | |
|---|---|---|---|
| 4,075,632 | 2/1978 | Baldwin et al. | 343/6.8 R |
| 4,104,630 | 8/1978 | Chasek | 343/6.5 R |
| 4,242,663 | 12/1980 | Slobodin | 340/152 T |
| 4,303,904 | 12/1981 | Chasek | 340/23 |
| 4,471,344 | 9/1984 | Williams | 340/572 |
| 4,656,463 | 4/1987 | Anders et al. | 340/572 |
| 4,663,625 | 5/1987 | Yewen | 340/825.54 |
| 4,739,328 | 4/1988 | Koelle et al. | 342/44 |
| 4,746,830 | 5/1988 | Holland | 310/313 D |
| 4,761,778 | 8/1988 | Hui | 370/46 |
| 4,771,429 | 9/1988 | Davis et al. | |
| 4,783,646 | 11/1988 | Matsuzaki | 340/572 |
| 4,841,527 | 9/1989 | Raychaudhuri et al. | 371/32 |
| 4,864,158 | 9/1989 | Koelle et al. | 307/231 |
| 4,888,373 | 12/1989 | Rossi et al. | 235/376 |
| 5,030,807 | 7/1991 | Landt et al. | 235/375 |
| 5,049,857 | 9/1991 | Plonsky et al. | 340/551 |
| 5,060,265 | 10/1991 | Finkelstien | 380/50 |
| 5,086,389 | 2/1992 | Hassett et al. | 364/401 |
| 5,095,493 | 3/1992 | Arthur et al. | 380/34 |
| 5,119,104 | 6/1992 | Heller | 342/450 |
| 5,128,959 | 7/1992 | Bruckert | 380/34 |
| 5,144,553 | 9/1992 | Hassett et al. | 364/401 |
| 5,148,485 | 9/1992 | Dent | 380/50 |
| 5,191,610 | 3/1993 | Hill et al. | 380/50 |
| 5,195,136 | 3/1993 | Hardy et al. | 380/50 |
| 5,237,612 | 8/1993 | Raith | 380/21 |
| 5,243,650 | 9/1993 | Roth et al. | 380/20 |
| 5,253,162 | 10/1993 | Hassett et al. | 364/405 |
| 5,278,905 | 1/1994 | McNair | 380/50 |
| 5,278,906 | 1/1994 | Boly et al. | 380/50 |
| 5,289,183 | 2/1994 | Hassett et al. | 340/905 |
| 5,363,448 | 11/1994 | Koopman, Jr. et al. | 340/825.31 |
| 5,365,225 | 11/1994 | Bachhuber | 340/825.31 |
| 5,377,270 | 12/1994 | Koopman et al. | 340/825.31 |

Primary Examiner—Jeffery Hofsass
Assistant Examiner—Timothy Edwards, Jr.
Attorney, Agent, or Firm—Frederick M. Fliegel

[57] ABSTRACT

A method and corresponding apparatus (10) for generating a pseudo-random number. The method has steps of generating a first bit stream from a number generator (16, 35), combining a predetermined number with the first bit stream to provide a second bit stream and feeding the second bit stream into a feedback port (32) of the number generator (16, 35).

27 Claims, 1 Drawing Sheet

DIVERGENT CODE GENERATOR AND METHOD

FIELD OF THE INVENTION

This invention relates in general to the field of random or pseudo-random numbers, in particular to electronically generated random or pseudo-random numbers and more particularly to substantially similar random or pseudo-random number generators capable of providing different data streams even when similarly initialized.

BACKGROUND OF THE INVENTION

Random or pseudo-random code generators are important for many electronic products requiring data having many of the attributes of random numbers such as lack of predictability, likelihood or high probability of two numbers being different and the like, wherein the numbers are realized through simple, efficient hardware in a timely fashion. Diverse examples of such electronic products include cryptographic apparatus, wherein pseudo-random numbers may furnish component portions of a cryptographic key; low probability of intercept communications apparatus, wherein pseudo-random numbers afford information security (sometimes in combination with low transmitted power levels); "spoof-proof" radar/lidar and/or other remote sensing systems requiring a variable code as the transmitted or probing signal; global positioning system equipment wherein pseudo-random numbers, some having repetition periods of on the order of a year or more, are employed both as codes for restricting access to appropriate users and to effect code division multiple access (CDMA) between a plurality of distinct signal sources; and multiple access communications gear, wherein a particular communication or communication channel or device is selected through a random or pseudo-random number, among others.

Pseudo-random or random number generators are readily realized but often suffer from lack of divergence or diversity. In applications where a population of substantially similar generators are employed, it is possible for two or more such generators to start or initialize from substantially the same state at the same time. When this occurs, it is unlikely that these generators will diverge, i.e., the generators may continue to produce substantially the same numbers for an unacceptably long interval. When proper operation of the system requires that the generators provide different numbers at least some of the time during some finite observation window or interval, system operation is compromised or inhibited.

Often, pseudo-random numbers are realized through some form of pseudo-random number generator, which may be conveniently realized as a linear feedback shift register (LFSR). LFSRs typically comprise a serial shift register including a serially coupled set of cells and a selection of taps along the serial register length. The selected taps are typically combined in some fashion and a result is "fed back" to other serial shift register cells, e.g., the first cell of the series. When a series of M many cells are employed and are appropriately interconnected via taps, an output data stream (known in the relevant art as a maximal length sequence) may be realized having a length of $2^M-1$ prior to repeating a complete prior output data stream.

A problem with such systems is that it is possible for the LFSR to initialize to a state known as "all zeroes" from which the LFSR cannot escape absent some external influence, i.e., the register is "stuck" and produces a special pseudo-random number, e.g., zero. This is generally undesirable in systems where a steady-state random or pseudo-random number is necessary or preferable for optimal system operation.

Thus, what is needed is a practical, economical apparatus and accompanying method for realizing a random or pseudo-random number, wherein (i) the random or pseudo-random number varies (i.e., does not get "stuck") and (ii) a plurality of such generators will diverge or provide different results during an observation interval even when two or more of the plurality start from substantially the same initial state at the same time.

DETAILED DESCRIPTION OF THE DRAWINGS

Figure 1:
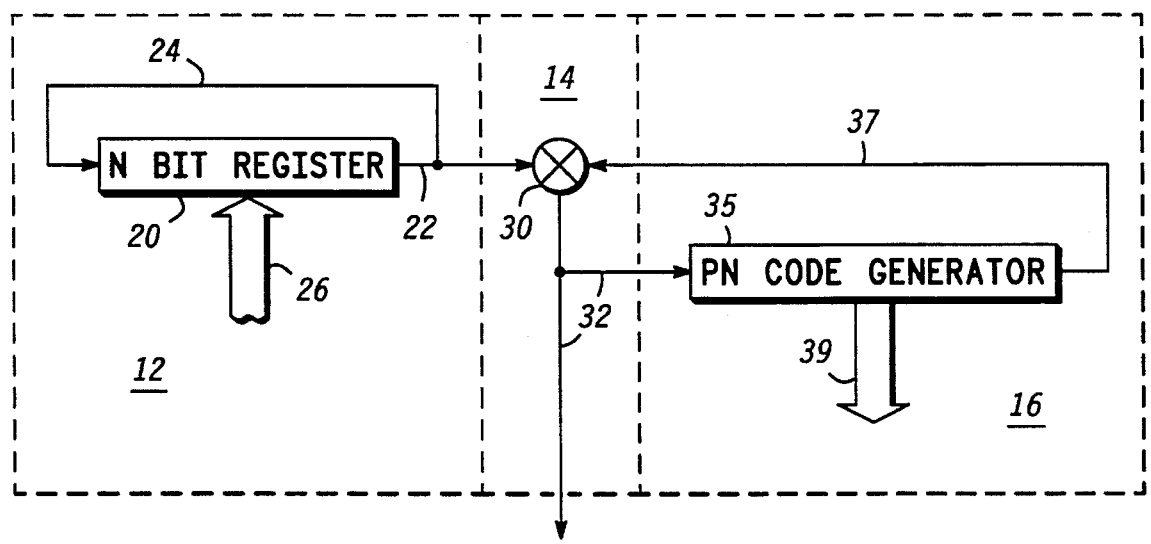
FIG. 1 is a block diagram of a pseudo-random number generator in accordance with the present invention.

FIG. 1 is a block diagram of code or number generator 10 in accordance with the present invention. Number generator 10 is contained in or is in data communication with a device (e.g., device 40, FIG. 2) or system that desirably includes some form of processor (not illustrated), coupled via data bus 26 for initially storing a predetermined number (e.g., a unique serial number chosen from a predetermined set of numbers or a predetermined set of serial numbers) in memory 12. Memory 12 desirably comprises N bit register 20 where N is an integer representing a number of bits in the shift register, which must be greater than or equal to the number of bits in the unique number. N is greater than one, and is usefully less than 1,000, desirably less than 100 and preferably less than 50. N bit register 20 has output or output tap 22 for providing a serial bit stream representation of the unique number stored in N bit register 20 and desirably includes feedback path 24. Feedback path 24 supplies the serial bit stream output signal of output or $N^{th}$ cell 22 back to a serial input or first cell of N bit register 20, forming a continuous circular shift register, recirculating shift register, recirculating memory or ring counter. In operation, N bit register 20 desirably starts counting in response to external signals (e.g., from a processor, not illustrated) to provide a serial bit stream at output 22, representing a series of repetitions of the predetermined number (e.g., serial number) stored in N bit register 20, i.e., "spins" a series of copies of the stored number through a continuous closed loop and provides an output signal out via output 22 in serial format. Output 22 is coupled to an input of combiner 14. A second input of combiner 14 is coupled to random or pseudo-random number generator 16.

Random or pseudo-random number generator 16 desirably comprises pseudo noise (PN) code generator 35. PN code generator 35 desirably includes a LFSR comprising M many stages and preferably includes a last tap coupled via output 37 to combining element 14. M is an integer greater than one and usefully less than or equal to one thousand, desirably less than or equal to one hundred and preferably is within the range of five to twenty. LFSRs are well known in the art as discussed in U.S. Pat. No. 5,195,136 issued to Hardy et al., which is hereby incorporated herein by reference. Combining element 14 usefully includes exclusive OR (XOR) gate 30 having inputs coupled to outputs 22, 37 and having output 32 coupled to (e.g., via a feedback port) PN code generator 35 (e.g., first stage or cell of an LFSR). PN code generator 35 desirably provides a parallel format pseudo-random number to an external processor (not illustrated) via data bus 39 and/or provides pseudo-random numbers in serial format via, inter alia, outputs 32, 37. Alternatively, random numbers may be realized from random or pseudo-random number generator 16 by digitizing random phenomena, e.g., Johnson noise, diode current fluctuations and the like.

When a pseudo-random or random number is required, an external processor or device (not illustrated) provides control signals that (i) spin N bit register 20 and (ii) spin or otherwise activate PN code generator 35 and/or random or pseudo-random number generator 16, output signals are (iii) supplied via outputs 22, 37 to combining circuit 14 and (iv) the result is supplied to input 32 of PN code generator 35 and/or random or pseudo-random number generator 16. A random or pseudo-random number (v) is then provided in parallel format at bus 39 and random or pseudo-random numbers are also provided at outputs 37, 32 in serial format. PN code generator 35 and/or random or pseudo-random number generator 16 thus provide random or pseudo-random numbers modified by the number stored in N bit register 20.

One advantage of this arrangement is that in a population of number generators 10 each having different numbers (e.g., serial numbers) stored in each of N bit registers 20, different random numbers are provided at each of busses 39 even when PN code generators 35 are all substantially similar or nominally identical, even when all of number generators 10 are all started at the same time, from the same initial state and when all of busses 39 are read at substantially the same time. A second advantage is that even when several of a group of number generators 10 including LFSRs as PN code generators 35 all start with an initial "all zeroes" state, at most one will stay in the "all zeroes" state and that one will only do so if the serial number stored in N bit register 20 is all zeroes. In this example, each of number generators 10 provide different numbers.

Figure 2:
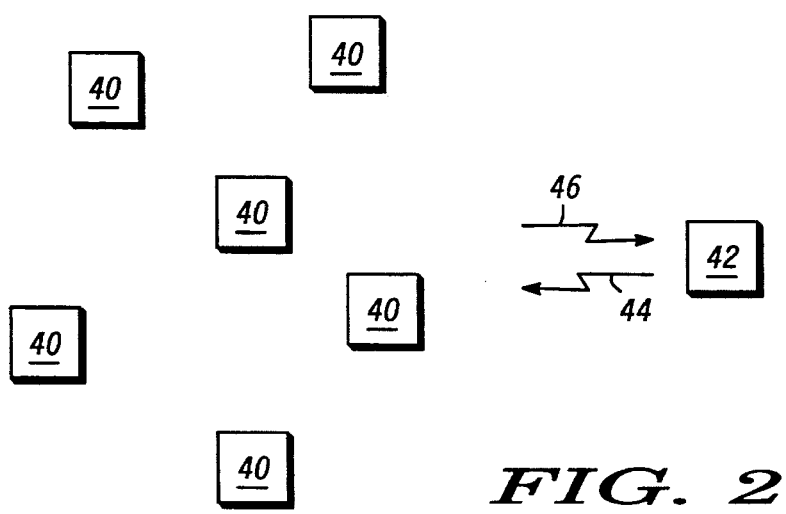
FIG. 2 is a simplified block diagram of a group of devices, including pseudo-random number generators, in communication with a central device.

FIG. 2 is a simplified block diagram of a group of devices 40, including number generators 10 (FIG. 1) within at least some of devices 40, in communication with a control device 42. It will be appreciated that such communication may be via radio frequency signals, electromagnetic signals, optical signals, acoustic signals and the like (e.g., signals 44, 46).

In one mode of operation, control device 42 may poll the entire population of devices 40 by transmitting a signal (e.g., signal 44) to request identification and/or other (e.g., status) data from each of devices 40 within transmission range of control device 42. It is often convenient for return signals (e.g., signal 46) to be transmitted from each of devices 40 at substantially the same frequency. Absent some discriminable form of diversity, control device 42 may be unable to receive and extract intelligence from return signals 46 because these signals may be coincident in time, frequency, power level etc.

Examples of diversity include time diversity, code diversity, frequency diversity, power level diversity etc. Once a first signal 46 results in identification of a specific device 40, a second signal 44 may be transmitted from control device 42 including data identifying the specific device 40 and including a "do not respond to subsequent polling until specifically told to" command. Alternatively, devices 40 may employ an inhibit timer to block further response to polling messages for some interval following receipt of a message 44 directed to the specific device 40. By subsequently polling the population of devices 40 and selecting and "turning off" one or more specific devices 40 during each polling cycle, the entire population of devices 40 within transmission range of control device 42 may be identified, communicated with and the population of devices 40 within transmission range of control device 42 identified and categorized.

It is advantageous to employ a polling technique allowing rapid categorization of the population of devices 40 within transmission range of control device 42. Power diversity allows only one device at most to be identified per polling cycle and may fall short of this ideal because simultaneous reception of two or more different signals may cause both or all of the received signals to be unintelligible. Frequency diversity complicates receiver design for control device 42. CDMA and time domain multiple access (TDMA) are two convenient techniques for receiving and discriminating between a group of signals in a fashion allowing at least some of the received signals to be identified during each polling cycle. Those specific devices 40 sourcing these received signals 46 may then be shut off by use of signals 44 coded to shut off the specifically identified signals as described supra and another group of specific devices 40 may be identified during a later polling cycle.

When the number of devices 40 being polled exceeds the number of "slots" available, "collisions" of at least some signals 46 from devices 40 to control device 42 are guaranteed to occur. In this scenario, it is essential to cause those devices 40 sourcing colliding signals 46 to diverge or differ in a way that permits control device 40 to uniquely identify each of devices 40 without having to resort to polling each device 40 individually. In some scenarios it is impractical to poll each device 40 individually because the population of devices 40 may be much greater than the number of discriminable or available polling slots. It may also be impractical or inefficient to poll each device 40 individually because it may not be known a priori which subset or how many of the population of devices 40 are within transmission range of control device 42.

This situation obtains when control device 42 is a tag reader in a highway tolling system, for example, and devices 40 represent tags for tolling an indeterminate number of vehicles traversing a toll road, bridge etc. Similar problems occur with automated luggage handling systems, aircraft identification systems, rail car identification systems, package handling systems etc. Remote identification apparatus and techniques are further described in U.S. Pat. No. 4,075,632, Baldwin et al., "Interrogation and Detection System", (Feb. 21, 1978); U.S. Pat. No. 4,104,630, Chasek, "Vehicle Identification System, Using Microwaves", (Aug. 1, 1978); U.S. Pat. No. 4,242,663, Slobodin, "Electronic Identification System", (Dec. 30, 1980); U.S. Pat. No. 4,303,904, Chasek, "Universally Applicable In-Motion and Automatic Toll Paying System Using Microwaves", (Dec. 1, 1981); U.S. Pat. No. 4,471,344, Williams, "Dual Frequency Anti-Theft System", (Sep. 11, 1984); U.S. Pat. No. 4,656,463, Anders et al., Limis System, Devices and Methods", (Apr. 7, 1987); U.S. Pat. No. 4,663,625, Yewen, "Passive Tag Identification System and Method", (May 5, 1987); U.S. Pat. No. 4,739,328, Koelle et al., "System For Identifying Particular Objects", (Apr. 19, 1988); U.S. Pat. No. 4,746,830, Holland, "Electronic Surveillance And Identification", (May 24, 1988); U.S. Pat. No. 4,783,646, Matsuzaki, "Stolen Article Detection Tag Sheet, And Method For Manufacturing The Same", (Nov. 8, 1988); U.S. Pat. No. 4,864,158, Koelle et al., "Rapid Signal Validity Checking Apparatus", (Sep. 5, 1989); U.S. Pat. No. 4,888,473, Rossi et al., "Wafer Disk Location Monitoring System And Tagged Process Carriers For Use Therewith", (Dec. 19, 1989); U.S. Pat. No. 5,030,807, Landt et al., "System For Reading And Writing Data From And Into Remote Tags", (Jul. 9, 1991); U.S. Pat. No. 5,049,857, Plonsky et al., "Multi-Mode Electronic Article Surveillance System", (Sep. 17, 1991); U.S. Pat. No. 5,086,389, Hassett et al., "Automatic Toll Processing Apparatus", (Feb. 4, 1992); U.S. Pat. No. 5,119,104, Heller, "Location System Adapted For Use In Multipath Environments", (Jun. 2, 1992); U.S. Pat. No. 5,144,553, Hassett et al., "Electronic Vehicle Toll Collection System And Method", (Sep. 1, 1992); U.S. Pat. No. 5,253,162, Hassett et al., "Shielding Field Method And Apparatus", (Oct. 12, 1993); and U.S. Pat. No. 5,289,183, Hassett et al., "Traffic Monitoring And Management Method And Apparatus", (Feb. 22, 1994), which patents are hereby incorporated herein by reference.

In the tolling arena, control device 42 may include or be in communication with a system (not illustrated) for tracking presence of vehicles including tags 40. Tolls may be assessed and accounted for by decrementing a previously-stored balance maintained in a memory (not illustrated) contained in tag 40 or by charging an external account. Alternatively, tolls may be assessed by noting a series of transactions indicative of distance traveled between a series of control devices 42 or number of times a particular control device 42 is encountered (e.g., repeated trips across a given tolling point).

A convenient technique for handling this situation is to employ time domain diversity, e.g., TDMA. In TDMA systems, time is divided into a series of P many slots or "windows" relative to some known time, conveniently defined relative to the time of interrogation transmission 44. In other words, a polling interval during which transmissions may be received is subdivided into a series of P many individual message windows. Each device 40 picks a slot in the range 1 . . . P based on a number from number generator 16 and/or code or number generator 10 and transmits message 46 including information allowing the specific device 40 to be identified when message 46 is received in intelligible form by control device 42. P is one or more and is usefully less than or equal to 8192, desirably less than or equal to 1024 and preferably is less than or equal to 256.

Those devices 40 occupying slots allowing identification of the specific device(s) 40 by control device 42 are then "turned off" via individually coded transmissions 44 from control device 42 and the remainder of the population of devices 40 is polled again. The polling cycle desirably is repeated until the population of devices 40 within transmission range of control device 42 is identified.

This technique allows the entire population of devices 40 to be interrogated, identified and characterized rapidly, in fewer iterations than might be required using alternative techniques but it requires that those devices 40 that chose an initial slot coincident with other devices 40 not continue to choose slots coincident with those chosen by the same other devices 40. When the slots are chosen through use of substantially identical random number generators 16 (FIG. 1) in each of devices 40, and when random or pseudo-random number generators 16 start from substantially similar initial states, it is desirable to ensure that random or pseudo-random number generators 16 will diverge (i.e., provide different random or pseudo-random numbers) within the polling window interval. The polling window may be determined by the length of time that a high speed vehicle is within transmission range of a relatively limited range system, i.e., may be relatively short.

Another convenient technique for handling this situation is to employ code domain diversity, e.g., CDMA. In CDMA systems, a code is selected from a predetermined series or series of Q many codes and information is transmitted via the code. For example, a "1" may be represented by a first code sequence (bit stream or sequence of "1s" and "0s") and a "0" may be designated by the inverse (e.g., a sequence of "0s" and "1s") of the first code sequence. The receiver correlates incoming data against a code template whereby a large signal is obtained when the code sequence specific to the particular template is received and a much smaller signal results from all other code sequences. Including a series of different code templates in the receiver allows simultaneous reception of a plurality of different signals characterized by different codes. Each remote device 40 picks a code in the series of Q many codes and transmits message 46 including information allowing the particular remote device 40 to be identified when message 46 is received in intelligible form by control device 42. The choice of which of the Q many codes to employ may be influenced or determined by a number from number generator 10 in each of devices 40. It is important in such a system that a pair of devices 40 starting with the same initial code choice diverge in later code choices in order to characterize the ensemble of devices 40 within transmission range of control device 42.

Thus, a number generator has been described that overcomes specific problems and accomplishes certain advantages relative to prior art methods and mechanisms. The improvements over known technology are significant. The expense, complexities, and high overhead effort of alternative systems are avoided.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method for generating a divergent code, said divergent code, for example, for ensuring that a population of transponders in devices such as RF tags having nominally identical apparatus for generating a delay will generate different delays, said apparatus being responsive to said divergent code, said delay being introduced prior to responding to an interrogation signal for polling said population of transponders, said method comprising steps of:

generating a first bit stream from a number generator;

combining, via a combiner having a first input coupled to an output of a memory, a second input coupled to an output of said number generator and an output coupled to an input of said number generator, a predetermined number from said memory with said first bit stream to provide a second bit stream; and feeding said second bit stream into a feedback port of said number generator.

2. A method as claimed in claim 1, wherein said generating step comprises a step of generating a first bit stream from a linear feedback shift register.

3. A method as claimed in claim 1, wherein said combining step includes steps of:

rotating said predetermined number through a shift register comprising said memory, said shift register having a series of N many shift register cells coupled to form a continuous closed loop, wherein a number N of cells in said shift register is greater than or equal to a number of bits comprising said predetermined number and at least one of said N many shift register cells includes an output tap; and adding a signal from said output tap to said first bit stream.

4. A method as claimed in claim 1, wherein said combining step includes a step of exclusive ORing said predetermined number with said first bit stream.

5. A method as claimed in claim 1, wherein said generating step includes a step of generating said first bit stream from a linear feedback shift register configured to provide a divergent code.

6. A method as claimed in claim 1, wherein said combining step includes a step of combining a unique serial number chosen from a predetermined set of serial numbers with said first bit stream to provide said second bit stream.

7. A method as claimed in claim 1, wherein said step of generating a first bit stream from a number generator includes a step of generating a first bit stream from a divergent code generator.

8. An apparatus for generating a number, said apparatus comprising:

a memory for storing a predetermined number;

a number generator; and a combiner having a first input coupled to an output of said memory, a second input coupled to an output of said number generator and an output coupled to an input of said number generator.

9. An apparatus as claimed in claim 8, wherein said number generator comprises a linear feedback shift register configured to provide a pseudo-random number.

10. An apparatus as claimed in claim 9, wherein said linear feedback shift register is configured to provide a maximal length sequence.

11. An apparatus as claimed in claim 9, wherein:

said number generator comprises a pseudorandom number generator including M many cells; and wherein M is an integer in a range of from five to twenty.

12. An apparatus as claimed in claim 8, wherein said memory comprises:

a shift register including N many cells;

wherein said output of said memory is coupled to an output of an $N^{th}$ cell of said shift register; and wherein an input of a first cell of said shift register is coupled to said output of said $N^{th}$ cell.

13. An apparatus as claimed in claim 8, wherein said memory comprises a recirculating memory.

14. An apparatus as claimed in claim 8, wherein said combiner comprises an exclusive OR gate.

15. An apparatus as claimed in claim 8, wherein said memory is configured to store a unique one of a predetermined set of different numbers.

16. An apparatus comprising:

a control device having a capability for sending a first message and receiving second messages; and a plurality of remote devices having a capability for receiving said first message and for transmitting said second messages, each of said plurality of remote devices comprising:

a memory for storing a predetermined number;
a number generator; and a combiner having a first input coupled to an output of said memory, a second input coupled to an output of said number generator and an output coupled to an input of said number generator.

17. An apparatus as claimed in claim 16, wherein said number generator comprises a linear feedback shift register configured to provide a maximal length sequence.

18. An apparatus as claimed in claim 16, wherein said second messages are transmitted at a time chosen in response to a number obtained from said number generator, said time denoting a time interval measured from a time of receipt of said first message.

19. An apparatus as claimed in claim 16, wherein said second messages comprise code domain multiple access messages encoded using a code chosen from a predetermined list of codes in accordance with a number obtained from said number generator.

20. An apparatus as claimed in claim 16, wherein said predetermined number is a serial number identifying a particular remote device of said plurality of remote devices.

21. An apparatus comprising:

a control device having a capability for sending a first message and receiving second messages; and a plurality of remote devices having a capability for receiving said first message and for transmitting said second messages, each of said plurality of remote devices comprising:

a memory for storing a predetermined number, wherein said predetermined number is a serial number identifying a particular remote device of said plurality of remote devices;

a number generator comprising a linear feedback shift register configured to provide a maximal length sequence;

a combiner having a first input coupled to an output of said memory, a second input coupled to an output of said number generator and an output coupled to an input of said number generator; and wherein said second messages are transmitted at a time, said time chosen in response to a number obtained from said number generator, said time denoting a time interval measured from a time of receipt of said first message.

22. An apparatus comprising:

a control device having a capability for sending a first message and receiving second messages; and a plurality of remote devices having a capability for receiving said first message and for transmitting said second messages, each of said plurality of remote devices comprising:

memory means for storing a predetermined number;

means for number generation, said number generation means having an input port and an output port, said number generation means for providing a first bit stream comprising a random number at said input port; and means for combining, said combining means having a first input coupled to an output of said memory and a second input coupled to an output of said number generation means, said combining means for combining said predetermined number with said first bit stream to provide a second bit stream at an output coupled to said input port.

23. An apparatus as claimed in claim 22, wherein said number generation means comprises a linear feedback shift register configured to provide a maximal length sequence at said first port.

24. An apparatus as claimed in claim 22, wherein said second messages are transmitted at a time chosen in response to a number obtained from said number generation means, said time denoting a time interval measured from a time of receipt of said first message.

25. An apparatus as claimed in claim 22, wherein said second messages comprise code domain multiple access messages encoded using a code chosen from a predetermined list of codes in accordance with a number obtained from said number generation means.

26. An apparatus as claimed in claim 22, wherein said predetermined number is a serial number identifying a particular remote device of said plurality of remote devices.

27. An apparatus as claimed in claim 22, wherein:

said predetermined number is a serial number identifying a particular remote device of said plurality of remote devices;

said number generation means comprises a linear feedback shift register configured to provide a maximal length sequence; and said second messages are transmitted at a time chosen in response to a number obtained from said number generation means, said time denoting a time interval measured from a time of receipt of said first message.

* * * * *